United States Patent [19]

DeMone

[11] 3,855,481

[45] Dec. 17, 1974

[54] N-STATE LOGIC CIRCUIT

[76] Inventor: Archibald James DeMone, 515 Bernardo Ave., Apt. 10, Sunnyvale, Calif. 94086

[22] Filed: Apr. 9, 1973

[21] Appl. No.: 349,144

[52] U.S. Cl. ......... 307/225 R, 307/209, 307/223 R, 307/289, 328/205

[51] Int. Cl. ......................... H03k 23/08, H03k 3/29

[58] Field of Search ............................ 307/223–225, 307/209, 289; 328/42, 43, 46, 49, 52, 205

[56] References Cited

UNITED STATES PATENTS 3,593,034 7/1971 Omote ............................... 307/223

*Primary Examiner*—John Zazworsky

[57] ABSTRACT

An improved electronic circuit having three or more operative stages and suitable for use as a logic element having more than two stable operating states. Each stage of the circuit has a circuit portion which is capable of being rendered operative or conductive while the other stages of the circuit are inoperative or nonconductive. Each stage includes a switch which opens and closes and has a particular output voltage representative of the particular operating state. The output voltages of the three stages are different from each other so that the operating states are discernible from each other. Several embodiments of the basic circuit are disclosed. A counter using a pair of logic elements of this invention is also disclosed.

10 Claims, 3 Drawing Figures

N-STATE LOGIC CIRCUIT

This invention relates to improvements in electronic circuitry of the type suitable for performing arithmetic and logic functions and, more particularly, to an improved circuit suitable for use as a logic element in numbers systems higher than binary.

Previous electronic logic elements have only two stable states and/or only two output voltage levels. This permits such elements to operate only in the binary number system. Thus, they cannot be used in number systems greater than binary.

The present invention is directed to an improved circuit which has a number of operating stages which are stable in operation and which permits one stage to operate while the other stages are inoperative. The number of stages is greater than two and any number of stages can be used. The circuit of this invention, therefore, provides a means which permits the realization of more than two stable operating states; thus, the invention is especially suitable for use with number systems higher than binary for electronic computers which perform arithmetic and logic functions. Moreover, the circuit of this invention can form a part of an electronic counter suitable for a wide number of different applications for counting particular events.

The primary object of this invention is to provide an improved logic element having a plurality of stable operating states wherein the logic element can operate in any one of the states when, in each state, the logic element has a discrete output voltage level to thereby permit the logic element to perform arithmetic functions in number systems higher than binary.

Another object of this invention is to provide a logic element of the type described wherein the same has a plurality of discrete operating stages with each stage being operable while the remaining stages are inoperable so that operation of the stages will represent respective stable operating states of the logic element and any such stage can be rendered operative depending upon which stable state is desired.

A further object of this invention is to provide an electronic counter formed of several logic elements of the present invention wherein the counter operates to increase or decrease its count from one to N-1 counts and which has, as an output, one of the N discrete voltage levels representing the count.

Still another object of this invention is to provide a simple electronic quantizer and analog-to-digital converter which will quantize an analog input to the nearest of N quantizing levels with an accuracy of one quantizing level and produce an output voltage at the nearest level after the input voltage has been removed.

A further object of this invention is to provide a simple digital-to-analog converter which will produce an output voltage of any one of a number of output levels corresponding to one of N separate input events.

Other objects of this invention will become apparent as the following specification progresses, reference being had to the accompanying drawings for an illustration of several embodiments of the invention.

Figure 1:
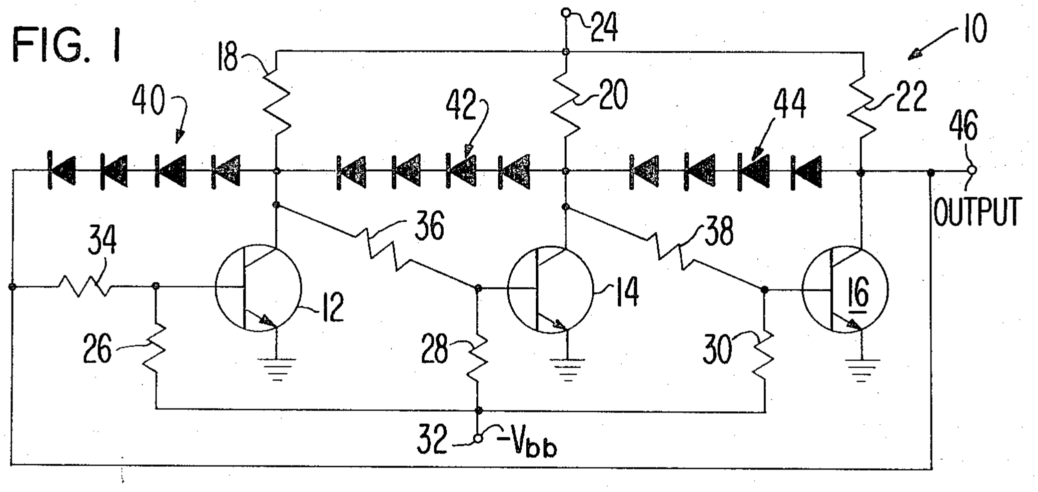
FIG. 1 is a schematic view of a basic form of the logic element of this invention, showing three stages for the case where N=3.

The basic logic element of this invention is shown in FIG. 1 and includes a circuit broadly denoted by the numeral 10. Circuit 10 has, for purposes of illustration, three identical stages to satisfy the condition of N=3. A greater number of stages can be provided as desired. The three stages of circuit 10 have respective bipolar junction transistors 12, 14 and 16 connected together by associated components. The collectors of the three transistors are coupled by respective resistors 18, 20 and 22 to a terminal 24 adapted to be connected to a source of positive voltage. The bases of the transistors have respective first biasing resistors 26, 28 and 30 coupled to a terminal 32 adapted to be coupled to a negative base biasing voltage supply, and respective second biasing resistors 34, 36 and 38 connected to the collector of the preceding stage, the stage having transistor 16 preceding the stage having transistor 12.

The three stages have respective diode strings 40, 42 and 44 which are connected between the collectors of each pair of adjacent stages. Each diode string is comprised of a number of diodes in series with each other, there being, for purposes of illustration, four diodes in each string. The emitter of each of the transistors is connected to ground. The circuit has an output terminal 46 connected directly to the collector of transistor 16.

Circuit 10 has three stable states corresponding to the three stages thereof. The circuit is in one of the states when a first of the stages thereof is conductive while the second and third stages are non-conductive. When, for instance, the first stage is conductive, current flows through transistor 12 while no current flows through transistors 14 and 16. Assuming, therefore, that transistor 12 is conductive, the voltage on its collector is near ground potential. Since resistors 28 and 36 of the second stage, i.e., the stage corresponding to transistor 14, form a voltage divider, the base of transistor 14 is maintained negative because resistor 28 is coupled to the negative bias voltage supply and resistor 36 is coupled to the collector of transistor 12 which is at near ground potential. This feature maintains the base of transistor 14 negative, thereby holding the transistor in a non-conductive condition.

Current through collector resistor 20 of transistor 14 flows through diode string 42 to the collector of transistor 12 and the voltage drop across diode string 42 adds to the near ground potential at the collector of transistor 12 to produce a voltage level at the collector of transistor 14 which is divided down by the voltage divider comprised of resistors 30 and 38 of the base circuit of transistor 16. This effectively produces a negative voltage on the base of transistor 16, thereby holding the latter in a non-conductive condition.

The current flow through collector resistor 22 of transistor 16 flows through diode string 44 to the collector of transistor 14 and also through diode string 42 to the collector of transistor 12. The voltage drop across diode string 44 adds to the collector voltage of transistor 14 to produce a voltage at the collector of transistor 16 which, when divided down by base resistors 26 and 34 of transistor 12, is sufficiently high to forward bias the base of transistor 12 and maintain the latter in a conductive condition. The voltages developed in this manner operate to reverse bias diode string 40 and the latter makes no contribution to circuit 10 when the first stage is conductive. However, diode string 40 operates to provide a specific voltage drop used in the manner described above when either the second or third stages are conductive.

Since each of the stages is identical to the other stages, any one of the stages can be in a conductive condition while the other two stages are non-conductive. The output voltage of circuit 10 is taken off terminal 46 and will be at a predetermined voltage level depending upon which stage is conductive. For instance, if transistor 12 is conductive, the output voltage will be the sum of the near ground potential at the collector of transistor 12, the voltage drop across diode string 42, and the voltage drop across diode string 44. In the case where the second stage is conductive, the output voltage will be the sum of the near ground potential of the collector of transistor 14 and the voltage drop across the diode string 44. In the case where the third stage is conductive, the output voltage will merely be the near ground potential at the collector of transistor 16. Thus, the three stages will have different output voltages representing the three stable states of circuit 10.

Circuit 10 may be set into each of its stable states in two different ways. The first way is to apply a signal directly to the base of the transistor in the stage which is to be made conductive. This will turn the corresponding transistor on and automatically turn the transistor of any previously conducting stage off. After circuit 10 has stabilized and is conductive in the desired state, the applied base signal may be removed and the circuit will remain stable in the desired state.

Another way of rendering circuit 10 conductive in a particular state is to apply at output terminal 46 a voltage equal to the normal output voltage of circuit 10 when the same is in the particular state. The driving source for this must be able to sink and source the amount of current which circuit 10 can source and sink, respectively. After the circuit has stabilized in the desired state, the applied voltage can be removed and circuit 10 will remain in the desired state.

While junction bipolar transistors have been illustrated in the various stages of circuit 10, such is merely for purposes of illustration only. For instance, field effect transistors may be substituted for the junction bipolar transistors shown in FIG. 1. If field effect transistors are used, the voltage presented to the gate of each transistor by the gate bias resistors would be sufficient to hold the transistor on or off as illustrated above with respect to circuit 10.

Figure 2:
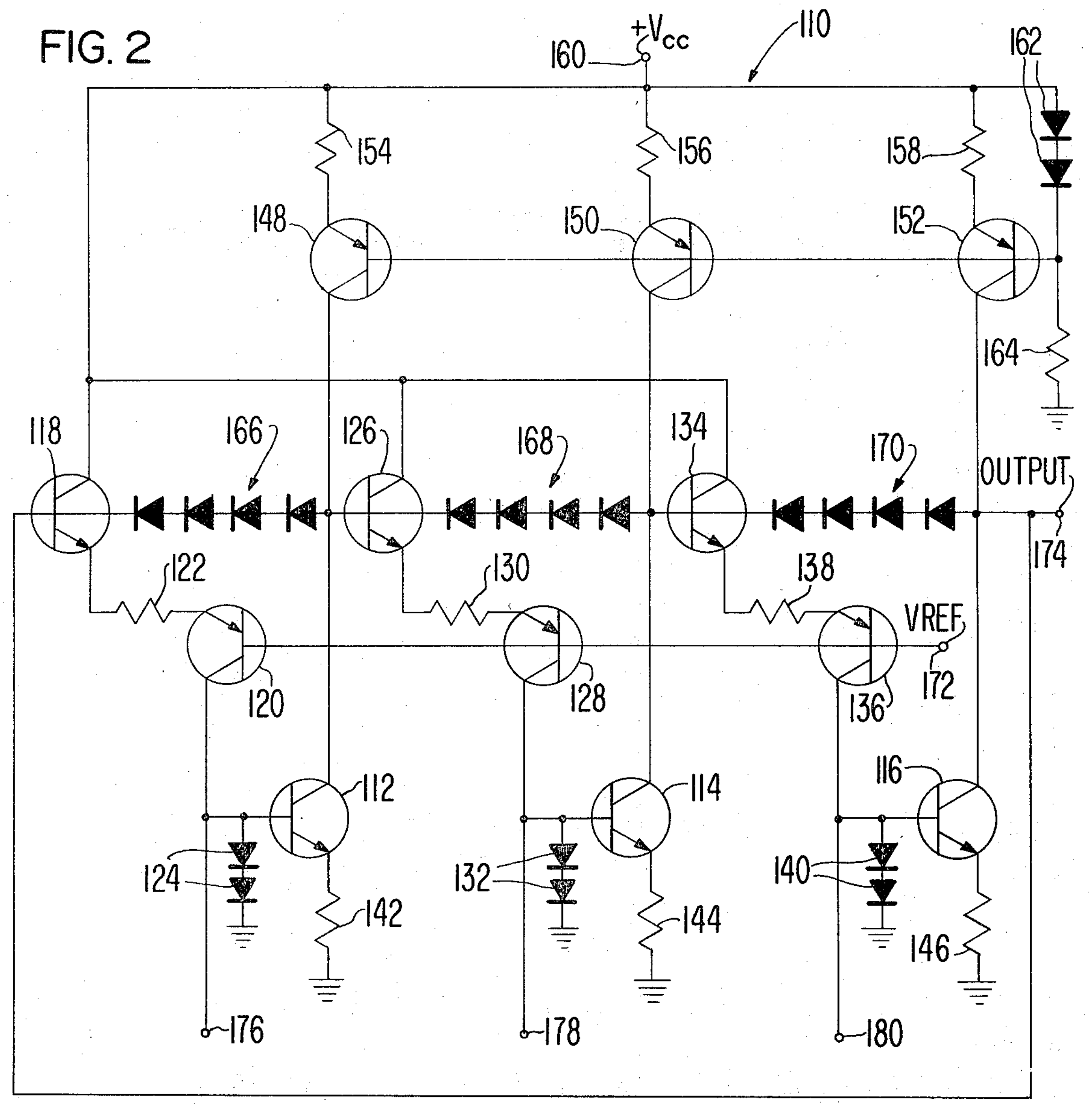
FIG. 2 is a modified form of the logic element of FIG. 1.

FIG. 2 is a more complete schematic of a logic element with N stable states. It shows a circuit 110 which has, for purposes of illustration, three stages including transistors 112, 114 and 116, respectively. Instead of the base biasing resistors shown in FIG. 1, such as resistors 26 and 34 of the first stage of circuit 10, circuit 110 utilizes a combination of transistors, resistors and diodes for biasing purposes. With respect to the first stage of circuit 110, the base biasing means includes a pair of transistors 118 and 120, the emitters of the transistors being connected by a resistor 122. A pair of biasing diodes 124 in series relationship couple the base of transistor 112 to ground. The base of transistor 112 is also coupled to the collector of transistor 120.

Similarly, the second stage of circuit 110 utilizes a pair of transistors 126 and 128 whose emitters are coupled together by a resistor 130. The collector of transistor 128 is coupled to the base of transistor 114 and a pair of biasing diodes 132 in series with each other are coupled between the base of transistor 114 and ground.

The third stage of circuit 110 utilizes a pair of transistors 134 and 136 whose emitters are coupled together by a resistor 138, the collector of transistor 136 being coupled to the base of transistor 116. A pair of biasing diodes 140 in series with each other are coupled between the base of transistor 116 and ground. The emitters of transistors 112, 114 and 116 have respective resistors 142, 144 and 146 coupled to ground to limit the current capabilities of transistors 112, 114 and 116.

Circuit 110 has current sources different from circuit 10 (FIG. 1). Instead of resistors, such as resistors 18, 20 and 22 of circuit 10, circuit 110 utilizes transistors 148, 150 and 152 whose emitters are coupled by respective resistors 154, 156 and 158 to a terminal 160 which is adapted to be coupled to a source of positive voltage. The collectors of transistors 148, 150 and 152 are coupled to the collectors of transistors 112, 114 and 116, respectively, and to the bases of transistors 126, 134 and 118, respectively. To complete the current source assembly, a pair of diodes 162 in series with each other are connected to the base of transistor 152 and to terminal 160, and a resistor 164 is coupled between the base of transistor 152 and ground.

A first diode string 166 is coupled between the bases of transistors 118 and 126; a second diode string 168 is coupled between the bases of transistors 126 and 134; and a third diode string 170 is coupled between the bases of transistors 118 and 134. Each diode string can have any number of diodes greater than one. For purposes of illustration, each diode string in FIG. 2 has four diodes.

The collectors of transistors 118, 126 and 134 are connected to each other. Also, the bases of transistors 120, 128 and 136 are connected together and are connected to a terminal 172 which is adapted to be coupled to a source of a reference voltage.

In use, and assuming that transistor 112 is conductive, circuit 110 operates with a voltage on the collector of transistor 112 which is at near ground potential. The voltage on the collector of transistor 114 will thereby be above the voltage on the collector of transistor 112 by an amount equal to the drop across diode string 168 which is conducting the current from current source transistors 150 and 152. However, the voltage on the collector of transistor 112 and the voltage across diode string 168, when added together, result in a voltage which is lower than the reference voltage applied to terminal 172. Thus, transistors 126, 128 and 134 and 136 are held in non-conductive conditions; thus, no current is provided to the bases of transistors 114 and 116. As the result, transistors 114 and 116 are maintained non-conductive.

The voltage at the collector of transistor 116 is above that at the collector of transistor 114 by an amount equal to the amount of voltage drop across diode string 170 whose diodes are conducting current from current source transistor 152. However, the voltage at the collector of transistor 116 is greater than the reference voltage applied to terminal 172; thus, transistors 118 and 120 are turned on and provide a current to diode 124, producing a voltage at the base of transistor 112, holding the same in a conductive condition. The diodes of diode string 166 are reversed biased and perform no function while the first stage of circuit 110 is conductive. However, diode string 166 operates to provide a voltage drop usable in the foregoing manner when either of the other stages are conductive.

Each stage of circuit 110 is identical to the other stages and may be turned on and kept on in the manner described above with respect to the first stage, the second and third stages remaining off while the first stage is on. When the first stage is on and conductive, the output voltage at terminal 174 coupled to the collector of transistor 116 is the sum of the near ground potential at the collector of transistor 112, the voltage drop across diode string 168 and the voltage drop across diode string 170. When the second stage is conductive, the output voltage at terminal 174 is the sum of the near ground potential at the collector of transistor 114 and the voltage drop across diode string 170. When the third stage of circuit 110 is conductive, the output voltage at terminal 174 is the near ground potential at the collector of transistor 116.

Circuit 110 may be set into any desired stable operating stage by supplying current to the base of any one of transistors 112, 114 or 116, specifically by coupling a current source to any one of terminals 176, 178 and 180 coupled directly to the bases of respective transistors 112, 114 and 116. Once the selected stage has been rendered conductive, the source of input current may be removed and the output voltage at terminal 174 will remain at the level corresponding to the conductive stage. In this mode of operation, the circuit produces an analog output voltage corresponding to one of several separate input events.

Circuit 110 may also be set to any desired stable operating state by applying to its output terminal 174 the specific voltage that would ordinarily appear if the desired stage were conductive. Such action causes the desired state to commence conducting and, after the circuit has stabilized, the applied voltage may be removed from terminal 174 and circuit 110 will remain in the desired stable operating state with an output voltage equal to the applied voltage. If the applied voltage is not at one of the discrete levels corresponding to a particular stable operating state of circuit 110, the circuit, upon removal of the applied voltage, will operate in the state which will produce the closest discrete output voltage to the applied voltage. Thereafter, the circuit will continue to operate in this state until another stage of the circuit is actuated.

Figure 3:
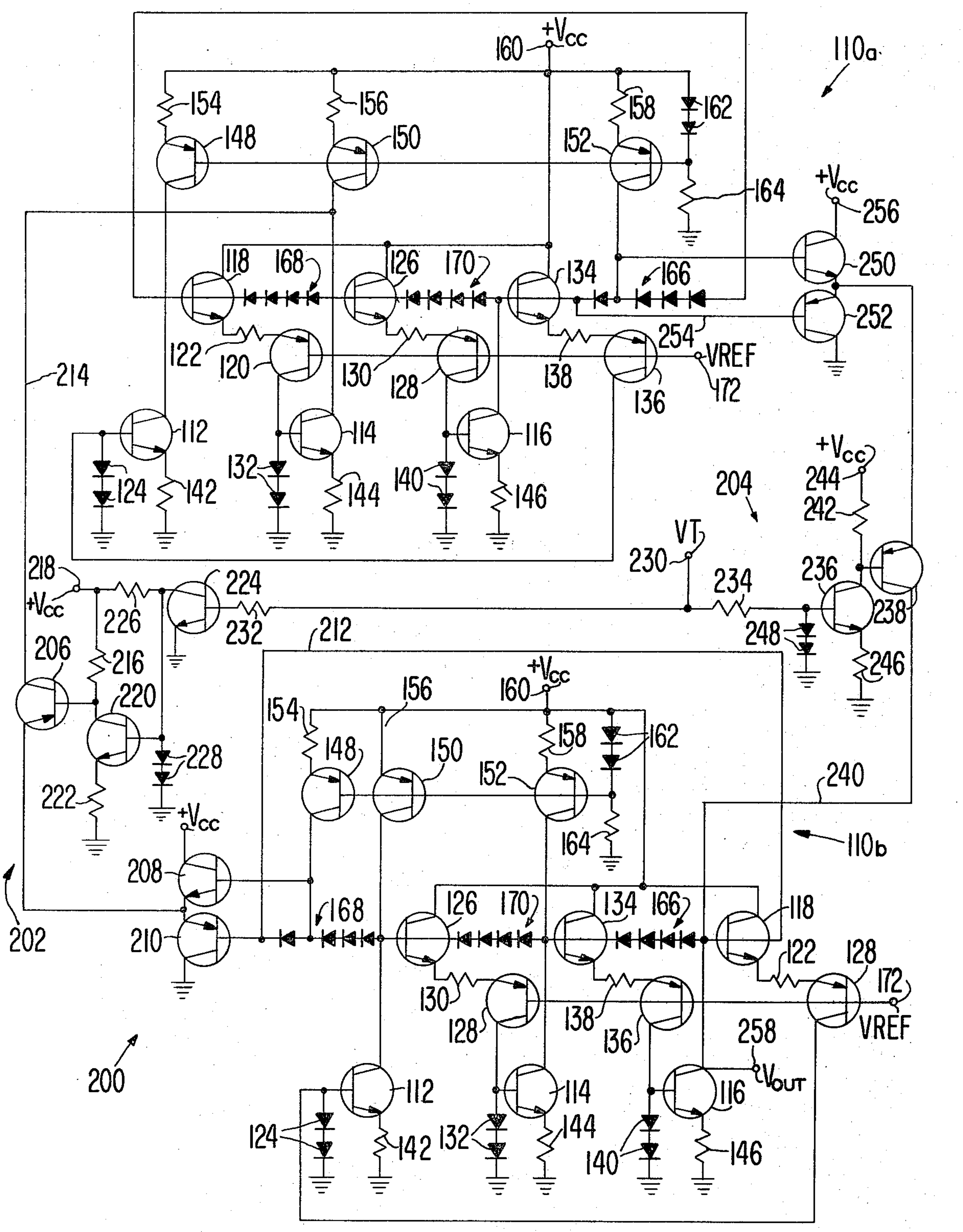
FIG. 3 is a schematic view of a counter circuit which utilizes two three-stage circuits of the type shown in FIG. 2.

The circuit of FIG. 2 can be used in a number of different applications for performing arithmetic and logic functions in numbers systems which are higher than binary. A particular application of the circuit is shown in FIG. 3 which illustrates a counter using two of the circuits of FIG. 2. The counter operates to count electronic events occurring at an input terminal and presents the count in the modulo three number system as one of three voltage levels.

The circuit of FIG. 3, denoted by the numeral 200, is comprised of two circuits **110*a* and 110*b* which are substantially of same construction as circuit 110 of FIG. 2. Thus, like numerals will apply equally between FIGS. 2 and 3.**

The two circuits **110*a* and 110*b* of circuit 200 are interconnected by two gates 202 and 204. Gate 202 includes a first transistor 206 whose emitter is coupled to the emitters of second and third transistors 208 and 210. The base of transistor 210 is coupled by a lead 212 to the collector of transistor 116 of circuit 110*b*. The base of transistor 210 is also connected to one end of diode string 168. The base of transistor 208 is coupled to the collector of transistor 148 of circuit 110*b*.**

The collector of transistor 206 of gate 202 is coupled by a lead 214 to the collector of transistor 114 of circuit **110*a*, thereby interconnecting the two circuits 110*a* and 110*b*. The base of transistor 206 is coupled to a resistor 216 connected to a terminal 218 adapted to be coupled to a source of positive voltage. The base of transistor 206 is also connected to the collector of another transistor 220 whose emitter is coupled by a resistor 222 to ground and whose base is coupled to the collector of another transistor 224 whose collector is coupled by a resistor 226 to terminal 218. A pair of biasing diodes 228 in series with each other couple the base of transistor 220** to ground.

A signal input terminal 230 is coupled by a resistor 232 to the base of transistor 224 of gate 202 by a resistor 234 to the base of a transistor 236 of gate 204, the collector of transistor 236 being coupled to the base of another transistor 238 whose collector is coupled by a lead 240 to the collector of transistor 116 of circuit **110*b*. The base of transistor 238 and the collector of transistor 236 are coupled by a resistor 242 to a terminal 244 adapted to be connected to a source of positive voltage. A resistor 246 couples the emitter of transistor 236 to ground and a pair of biasing diodes 248 in series with each other couple the base of transistor 236** to ground.

The emitter of transistor 238 of gate 204 is coupled to the emitter of a pair of transistors 250 and 252, the base of transistor 252 being coupled by lead 254 to the collector of transistor 116 of circuit **110*a*. The collector of transistor 250 is coupled to a terminal 256 adapted to be connected to a source of positive voltage and the base of transistor 250 is coupled to the collector of transistor 152 of circuit 110*a*, the collector of transistor 252** being coupled directly to ground.

In use, circuit 200 operates as follows: when gate 202 is closed, gate 204 is open and the collector of transistor 114 of circuit **110*a* is connected by lead 214, by closed gate 202 and by lead 212 to the collector of transistor 116 of circuit 110*b*, such collector having an output terminal 258 connected directly thereto. When gate 204 is closed, gate 202 is open and the collector of transistor 116 of circuit 110*a* is coupled by lead 254, by closed gate 204 and by lead 240 to the collector of transistor 116 of circuit 110*b*.**

When circuit 200 is operating, the voltage at input terminal 230 is rendered at near ground potential. When this occurs, gate 202 is closed and gate 204 is open. This, therefore, interconnects the collector of transistor 114 of circuit **110*a* with the collector of transistor 116 of circuit 110*b*, thereby forcing the potential at the collector of transistor 114 of circuit 110*a* to assume the value of that at the collector of transistor 116 of circuit 110*b*.**

The potential at the collector of transistor 116 of circuit **110*a* is one count higher, in the modulo three number system, then that at the collector of the adjacent transistor 114. When the potential at terminal 230 goes high, gate 202 opens and gate 204 closes, causing the potential at the collector of transistor 116 of circuit 110*b* to take on the value of the potential of the collector of transistor 116 of circuit 110*a* because these two collectors are interconnected through leads 240 and 254 by the closing of gate 204. Thus, the count at the output of terminal 258 will have increased by one because of the one count increases of the collector of transistor 116 of circuit 110***a* with respect to the collector of the adjacent transistors 114.

When the potential at input terminal 230 goes low again, gate 202 again closes and gate 204 opens, again forcing the potential at the collector of transistor 114 of circuit 110*a* to assume the value of the potential at the collector of transistor 116 of circuit 110*b* which is now higher by one count. Thus, the output voltage of the collector of transistor 116 of circuit 110*b* has increased by one count from an excursion from low to high and back to low of the potential at input terminal 230. The counter can be made to count down by connecting the input of gate 204 to the collector of transistor 112 of circuit 110*a*. In view of the foregoing, circuit 200 illustrates an N=3 counter. In higher numbered systems, the circuit can be made to count up or down by from 1 to N-1 counts by the appropriate connection of the gates between circuit portions.

I claim:

1. An electronic circuit for generating an output signal having N discrete levels each representative of a different stable state where N > 3, said circuit comprising:

N bistable elements each having first and second terminals adapted to be coupled to first and second reference voltage sources and a control input terminal adapted to be coupled to an actuating signal;

a plurality of unidirectional conducting devices for coupling together the first terminals of adjacent ones of said bistable elements, one of said first terminals serving as an output terminal for manifesting said N level output signal; and means for coupling said first terminal of individual ones of said bistable elements to the control input terminal of an adjacent one of said bistable elements so that actuation of one of said bistable elements by the application to the control input terminal thereof of an actuating signal maintains the control input terminal of the adjacent bistable element at a signal level sufficient to hold said adjacent bistable element in an non-actuated state, the remaining ones of said bistable elements being held in the non-actuated state by said unidirectional conducting devices.

2. The invention of claim 1 wherein said coupling means includes N voltage dividers each coupled between different ones of said bistable elements, each said voltage divider having one terminal thereof coupled to said first terminal of the associated bistable element, another terminal coupled to a third reference voltage source and an intermediate terminal coupled to the control input terminal of the adjacent one of said bistable elements.

3. The invention of claim 2 wherein each of said voltage dividers comprises a pair of resistors coupled in series, said intermediate terminal comprising the junction between said resistors.

4. The invention of claim 1 wherein said coupling means comprises a plurality of pairs of transistors, each pair of transistors having a first transistor with the base thereof coupled to the first terminal of a different one of said bistable elements, a second transistor having the base thereof coupled to an input terminal adapted to be coupled to a fourth reference voltage source, each said pair of transistors having common elements coupled together, the remaining terminal of said first transistor of each said pair being coupled to said first reference voltage, the remaining terminal of the other transistor of each said pair being coupled to the control input terminal of the adjacent bistable element.

5. An electronic counter comprising: a pair of logic elements, each logic element having a circuit operable in any one of N stable states representing a modulo N number system, each circuit including a plurality of operative stages, each stage adapted to be rendered operative when an input signal at a predetermined level is applied thereto, means responsive to means responsive to the actuation of one stage to the operative state by the application of an input signal thereto for applying an input signal at said predetermined level to an adjacent stage, whereby said adjacent stage is rendered and maintained operative, means responsive to the operation of a stage for maintaining the other stages inoperative, whereby each stage provides a respective stable operating state for a corresponding circuit, each stage of each circuit having a discrete potential with respect to the other stages of the circuit when a stage thereof is operative, the potentials of the stages of each circuit representing different counts of said number system, at least a first of said circuits having a signal output; and means responsive to a second input signal for alternately coupling one of the stages of said first circuit with a pair of stages of the second circuit, whereby one of said pair of adjacent stages of the second circuit will assume the potential of the stage of the first circuit and thereafter the stage of the first circuit will assume the potential of the other stage of said pair to thereby permit the output of the first circuit to represent counts of said number system.

6. An electronic counter as set forth in claim 5, wherein said coupling means includes an electronic gate.

7. An electronic counter as set forth in claim 5, wherein said coupling means includes a first electronic gate coupling said one stage of the first circuit with one of said pair of stages of the second circuit, and a second gate coupling said one stage of the first circuit with the other of said pair of stages of the second circuit, the first gate being open when the second gate is closed and vice versa.

8. An electronic counter as set forth in claim 5, wherein each stage includes a transistor operating as an electronic switch to render the corresponding stage operative, said coupling means being operable to alternately connect the collector of the transistor of said one stage of the first circuit with the collectors of the transistors of said pair of stages of the second circuit.

9. An electronic counter as set forth in claim 5, wherein the potential of said one of said pair of stages is less than the potential of the other stage of said pair to thereby permit the output of the first circuit to provide a count up from a predetermined reference number.

10. An electronic counter as set forth in claim 5, wherein said one of said pair of stages of the first circuit has a potential greater than the other of said pair of stages to thereby permit the output of the first circuit to provide a count down from a predetermined reference number.

* * * * *